US012025892B2

(12) United States Patent
Hsu et al.

(10) Patent No.: US 12,025,892 B2
(45) Date of Patent: Jul. 2, 2024

(54) ELECTRONIC DEVICE WITH CONDUCTIVE LINES HAVING DIFFERENT WIDTHS

(71) Applicant: InnoLux Corporation, Miao-Li County (TW)

(72) Inventors: Chih-Hao Hsu, Miao-Li County (TW); Chia-Min Yeh, Miao-Li County (TW); Hsieh-Li Chou, Miao-Li County (TW); Cheng-Tso Chen, Miao-Li County (TW); Hui-Min Huang, Miao-Li County (TW); Li-Wei Sung, Miao-Li County (TW); Yu-Ti Huang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 0 days.

(21) Appl. No.: 18/065,150

(22) Filed: Dec. 13, 2022

(65) Prior Publication Data
US 2023/0116089 A1    Apr. 13, 2023

Related U.S. Application Data

(63) Continuation of application No. 16/941,863, filed on Jul. 29, 2020, now Pat. No. 11,567,377.

(30) Foreign Application Priority Data

Aug. 22, 2019  (CN) .......................... 201910779019.3

(51) Int. Cl.
*G02F 1/1362* (2006.01)
*G02F 1/1345* (2006.01)
*H10K 59/131* (2023.01)

(52) U.S. Cl.
CPC .... *G02F 1/136286* (2013.01); *G02F 1/13454* (2013.01); *H10K 59/131* (2023.02); *G02F 1/136295* (2021.01)

(58) Field of Classification Search
CPC .......................... G02F 1/13452; G02F 1/1345
See application file for complete search history.

(56) References Cited

U.S. PATENT DOCUMENTS 11,454,851 B2    9/2022 Long et al.

FOREIGN PATENT DOCUMENTS

| CN | 10-3185999 | * | 7/2013 | ........... G02F 1/1362 |
| CN | 207557624 U | | 6/2018 | |
| WO | WO-2018-003795 | * | 4/2018 | ........... G02F 1/1368 |

OTHER PUBLICATIONS

Chinese language office action dated Jan. 24, 2024, issued in application No. CN 201910779019.3.

* cited by examiner

*Primary Examiner* — Lauren Nguyen
(74) *Attorney, Agent, or Firm* — McClure, Qualey & Rodack, LLP

(57) ABSTRACT

An electronic device having a peripheral area is provided. The electronic device includes a substrate; and a first conductive line disposed on the substrate in the peripheral area and including a first section and a second section electrically connected to the first section. An overlapping region is defined as a region that the first section overlaps the second section in a top view of the electronic device. The first section has a first minimum width inside the overlapping region and a second minimum width outside the overlapping region. The second section has a third minimum width outside the overlapping region. The first minimum width is greater than the second minimum width and greater than the third minimum width.

9 Claims, 9 Drawing Sheets

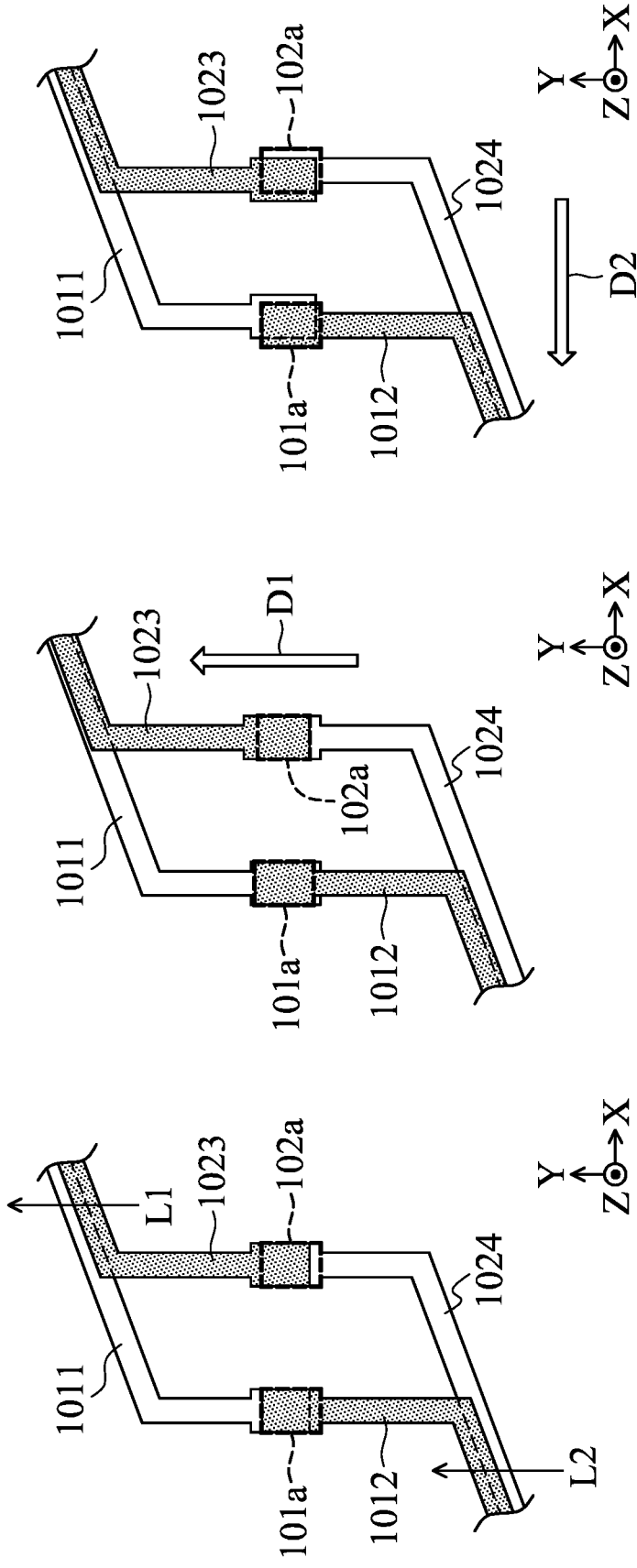

ELECTRONIC DEVICE WITH CONDUCTIVE LINES HAVING DIFFERENT WIDTHS

CROSS-REFERENCE TO RELATED APPLICATIONS

This application is a Continuation of U.S. patent application Ser. No. 16/941,863, filed on Jul. 29, 2020, which claims priority of China Application No. 201910779019.3, filed on Aug. 22, 2019, which is incorporated by reference herein in its entirety.

BACKGROUND

Technical Field

The disclosure relates to an electronic device, and more particularly to an electronic device having wiring groups.

Description of the Related Art

Electronic devices such as smartphones, tablets, laptops, monitors, and televisions have become indispensable necessities in modern day life. With the vigorous development of such electronic products, consumers have high expectations for the display quality and performance of such products.

In electronic devices, wiring design of control wires (such as scan lines or data lines in an active area) in a driving circuit (such as IC) and an active area (such as display area) has an important influence on the electronic devices. Using a display device as an example, if the layout of the wiring between the driving circuit and the control wires is not optimal, the wires in different areas will have a large variation (for example, a large resistance difference among different wires). This leads to differences in brightness in different areas of the display area of the display device, resulting in unwanted display problems such as band "mura" (e.g., horizontal and vertical stripes).

Therefore, further improvements in the wiring of current electronic devices are still required.

SUMMARY

In accordance with some embodiments of the present disclosure, an electronic device is provided. The electronic device includes a substrate, a driving circuit disposed on the substrate, an active area disposed on the substrate, and a wiring group disposed on the substrate and between the driving circuit and the active area. The wiring group includes a first conductive line and a second conductive line. The first conductive line has a first section and a second section. The second section is electrically connected to the first section. The second section is disposed between the first section and the active area. The second conductive line is adjacent to the first conductive line. The second conductive line includes a third section and a fourth section. The fourth section is electrically connected to the third section. The fourth section is disposed between the third section and the active area. The first section and the second section are not the same layer. The first section and the fourth section are the same layer. The second section and the third section are the same layer.

In accordance with some embodiments of the present disclosure, an electronic device having a peripheral area is provided. The electronic device includes a substrate; and a first conductive line disposed on the substrate in the peripheral area and including a first section and a second section electrically connected to the first section. An overlapping region is defined as a region that the first section overlaps the second section in a top view of the electronic device. The first section has a first minimum width inside the overlapping region and a second minimum width outside the overlapping region. The second section has a third minimum width outside the overlapping region. The first minimum width is greater than the second minimum width and greater than the third minimum width.

In order to make the features or advantages of the present disclosure more obvious and understandable, the preferred embodiments with drawings are described below for detailed description.

BRIEF DESCRIPTION OF THE DRAWINGS

FIG. 9A schematically illustrates a portion of top view of two wires according to some embodiments of the present disclosure.

FIGS. 9B and 9C are the schematic diagrams of the displacement of different sections in the same layer resulting from the process variation illustrated in FIG. 9A.

DETAILED DESCRIPTION

Figure 1:
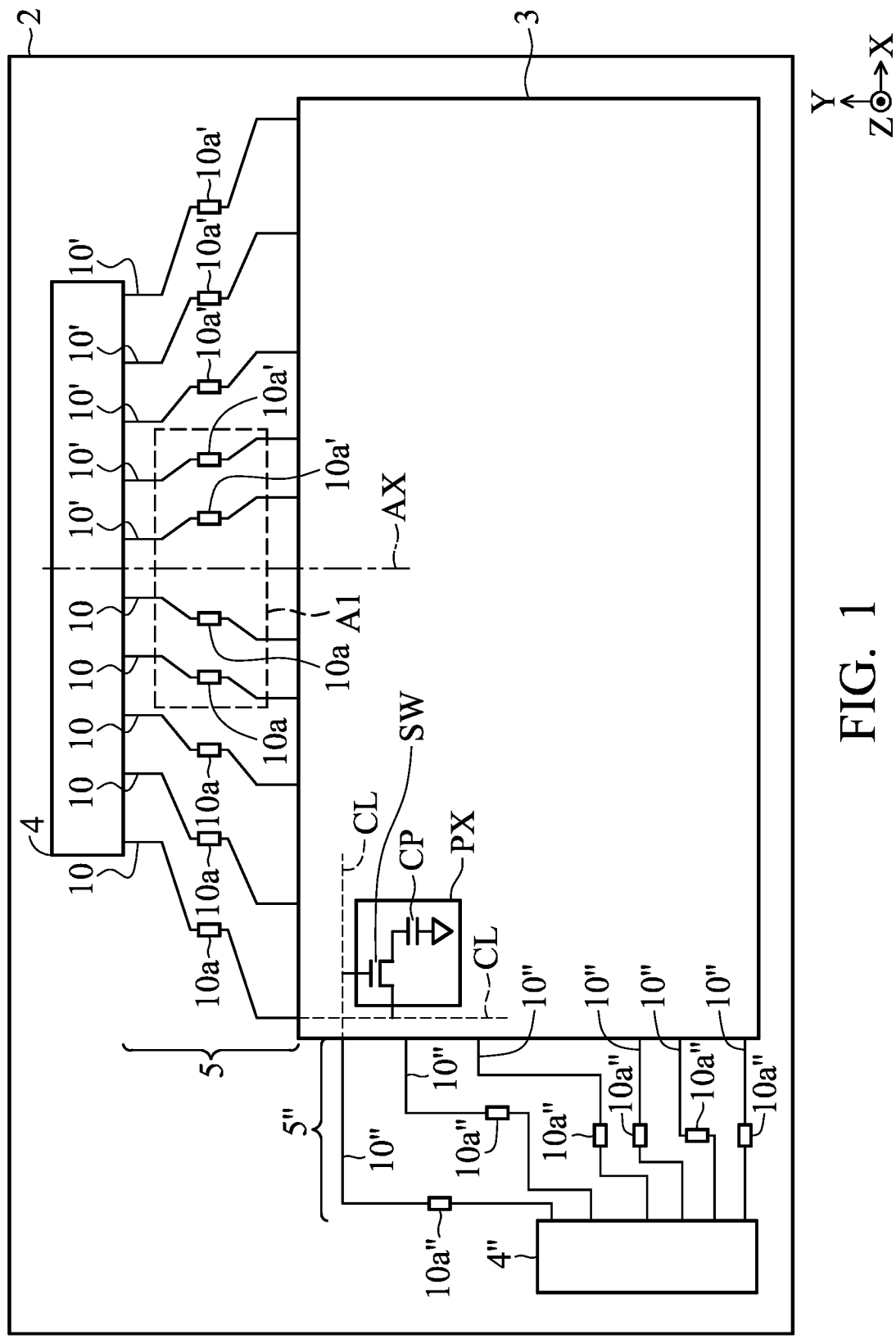
FIG. 1 schematically illustrates a top view of electronic device according to some embodiments of the present disclosure.

The following disclosure provides many different embodiments, or examples, for implementing different features of the subject matter provided. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features. In addition, the present disclosure may repeat reference numerals and/or letters in the various examples. This repetition is for the purpose of simplicity and clarity and does not in itself dictate a relationship between the various embodiments and/or configurations discussed.

It should be noted that the elements or devices in the drawings of the present disclosure may be present in any form or configuration known to those with ordinary skill in the art. In addition, in this specification, relative expressions are used. For example, "lower", "bottom", "higher" or "top" are used to describe the position of one element relative to another. It should be appreciated that if a device is flipped upside down, an element that is "lower" will become an element that is "higher".

It should be understood that although the terms "first", "second", "third" etc. may be used herein to describe various elements, components, regions, layers, and/or portions, these elements, components, regions, layers, and/or portions should not be limited by these terms. These terms are only used to distinguish one element, component, region, layer, and/or portion or section from another region, layer or section. Thus, a first element, component, region, layer, or portion discussed below could be termed a second element, component, region, layer, or portion without departing from the teachings of the present disclosure.

The description of the exemplary embodiments is intended to be read in connection with the accompanying drawings, which are to be considered part of the entire written description. It should be noted that the drawings are not drawn to scale. In addition, structures and devices are shown schematically in order to simplify the drawing and clearly express the features.

Herein, the terms "about", "approximately" and "substantially" typically mean +/−20% of the stated value or range, typically +/−10% of the stated value or range, typically +/−5% of the stated value or range, typically +/−3% of the stated value or range, typically +/−2% of the stated value or range, typically +/−1% of the stated value or range, and typically +/−0.5% of the stated value or range. The stated value of the present disclosure is an approximate value. Namely, the meaning of "about", "around" and "substantially" may be implied if there is no specific description of "about", "around" and "substantially".

In some embodiments of the present disclosure, terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise. Terms concerning "electrically connected" may be in physically and directly contact over through an intermediate component for transmitting electronic signal.

In the present disclosure, term concerning "same layer" means that two objects are formed of the same material and formed by the same process. For example, a thin film may become two separate pattern units through a lithography-etching process. The two pattern units are the same layer. Terms concerning "not the same layer" and "different layer" mean that two objects are formed by different processes. For example, a first film becomes a first pattern unit through a lithography-etching process. Then an insulating layer is formed on the first thin film. Next, a second thin film layer is formed on the insulating layer. The second thin film becomes a second pattern unit through the other lithography-etching process. That is, the first pattern unit and the second pattern unit are not the same layer.

In some electronic devices, there may be a plurality of control wires (such as scan lines or data lines in some electronic devices) located in an active area and configured to provide driving signals for pixel units; a peripheral area outside the active area; a driving circuit for outputting driving signals; and a plurality of fan-out wires (hereinafter also referred to as wires) located in the peripheral area outside the active area and electrically connected to both the driving circuit and the control wires. The group of fan-out wires may be referred to as a "wiring group" or a "wiring structure". In other embodiments, the control wires may be touch signal wires or common electrode wires, as long as the control wires may be disposed in the electronic device. In some cases, the width of the edge of the driving circuit is small, yet the width of the partial edge of the corresponding active area (the corresponding control wires) is large. Therefore, the wires may naturally show a fan-like wiring from the driving circuit towards the active area or other wiring patterns with different widths at both ends. The control wires may be electrically connected to an element in the electronic device (such as a thin film transistor (switching element) or a capacitor in a pixel unit). With the aforementioned structure, the driving circuit is electrically connected to at least one of the control wires of the active area through the fan-out wires of the wiring group, and the control signal is transmitted to the desirable elements. The driving circuit may be an integrated circuit (IC), a flexible printed circuit board (FPC), a chip on film (COF), a tape carrier package (TCP), a printed circuit board or other types of external signal control or signal transmission unit. The driving circuit may be directly mounted on the substrate, which is referred to as Chip on Glass (COG), or bonded to the substrate, and electrically connected to the wires of the wiring group to be used as time control, scan line control, data line control or other drive control. It is not intended to be limiting.

As display devices require higher resolutions, narrower border widths or other requirements, wiring density in electronic devices needs to be further increased. In order to increase utilization of an area of a substrate of an electronic device, when viewing the substrate along the normal direction of the substrate, wires in different layers may be not only alternately arranged but also be partially overlapped to increase the wiring density. However, in the actual production of wires, even if the related parameters are controlled, the production of wires for different layers still has various variations due to various processing factors.

For example, the position of the wires of different layers may deviate from the desired position, or its width may vary. When the wires are offset, the overlapping area between the wires of different layers may be changed, so that the capacitance between the wires is different from the originally designed capacitance. When the widths of the wires change, the resistance between the wires formed by different processes may also be different. The various variations described above may cause differences and unevenness in the load or impedance of the wires in various regions. Eventually, the display device will experience unwanted problems such as mura which reduces the display quality.

Therefore, in accordance with some embodiments, the present disclosure provides an electronic device including a substrate, an active area disposed on the substrate, and a wiring group disposed at the peripheral area outside the active area. The wiring group is disposed between the active area and the driving circuit. The wiring group includes a first wire and a second wire adjacent to the first wire. The wiring group may further include other wires. The first wire includes a first section and a second section. The first section and the second section are different layer and the first section is electrically connected to the second section. The second wire includes a third section and a fourth section. The third section and the fourth section are different layer and the third section is electrically connected to the fourth section. When viewing the substrate along the normal direction of the substrate, the first section is farther than the second section to the active area and the fourth section is farther than the third section to the active area. In other words, the second section is disposed between the first and the active area, and the fourth section is disposed between the third section and the active area. The first section and the fourth section are the same layer, and the second section and the third section are the same layer. Other wires of the wiring group may also refer to the structure of the first wire and the second wire. For example, other wires of the wiring group may be paired and adjacent to each other or paired but non-adjacent to each other. Other wires of the wiring group may be arranged in the forward order or reverse order of the structure of the first wire and the second wire. It is not intended to be limiting.

That is, each of two adjacent wires has one section formed in one process and the other section formed in the other process. Two sections are in different layers. It may make the variations (such as width variation, position variation, etc.) resulting from the processes being dispersed on different wires, so that there may still be a similar load or impedance between the wires. Therefore, each area of the electronic device is maintained in a state similar to that of the original design to avoid regional changes caused by process variations. Furthermore, since the adjacent sections between different wires may be different layers, the distance between the wires may not be limited by the spacing (the spacing between two independent pattern units in the same layer) of a single exposure (lithography-etching process). Therefore, the spacing between the wires may be reduced and the wiring layout may be closer.

FIG. 1 schematically illustrates a top view of an electronic device according to some embodiments of the present disclosure. That is, the electronic device is viewed in the Z direction in FIG. 1. It should be understood that, in order to simplify the illustration and highlight the technical features of the present disclosure, the electronic device shown in FIG. 1 does not illustrate all the components.

The electronic device described in the present disclosure may include a display device, an antenna device, a sensing device or a splicing device, but it is not intended to be limiting. The electronic device may be a bendable or flexible electronic device. The display device may be a self-emitting type organic light-emitting diode display (OLED Display) or inorganic light-emitting diode display (LED Display) or a non-self-emitting type liquid crystal display (LCD) that requires a backlight module. The display device may include, for example, liquid crystal, light-emitting diode (such as organic light-emitting diode (OLED), inorganic light-emitting diode (LED), mini-meter sized LED (mini LED), micro-meter sized LED (micro LED) or quantum dot (QD) such as QLED, QDLED, other suitable materials or components, and the materials or components described above may be combined in any combination. It is not intended to be limiting. The antenna device may be, for example, a liquid crystal antenna. It is not intended to be limiting. The splicing device may be, for example, a display splicing device or an antenna splicing device. It is not intended to be limiting. It should be noted that the electronic device may be any combination of the devices described above. It is not intended to be limiting.

Referring to FIG. 1, in some embodiments, the electronic device may include a substrate 2 and an active area 3 disposed on the substrate 2, a driving circuit 4, and a wiring group 5 disposed between the active area 3 and the driving circuit 4. In some embodiments, the active area 3 may include control wires CL (such as data lines or scan lines, only a portion of the control wires are illustrated by a dotted line in FIG. 1, the actual shape and position are not limited thereto) and elements (e.g., switching element SW (thin film transistor) or capacitor CP). The control wires CL may be electrically connected to the elements. The two ends of the wiring group 5 between the driving circuit 4 and the active area 3 are respectively used to electrically connect the driving circuit 4 and the control wires CL in the active area 3. The fan-out wires of the wiring group 5 and the driving circuit 4 may be directly and physically connected or electrically connected through an intermediate element. The fan-out wires of the wiring group 5 and the control wire CL of the active area 3 may be directly and physically connected or electrically connected through an intermediate element. As such, the signal of the driving circuit 4 may be transmitted to the switching element SW, the capacitor CP or other circuit elements of the pixel unit PX in the active area 3.

The position and number of the drive circuit 4 may be adjusted according to actual needs. The single side of the active area 3 may correspond to one or a plurality of the driving circuit 4. When the single side corresponds to a plurality of the driving circuit 4, the active area 3 may be divided into some portions corresponding to the driving circuit 4, respectively. A plurality of the wires included in the wiring group 5 may also have various configurations according to the needs of these designs. For example, it has a plurality of fan-out wires electrically connected to the corresponding driving circuit 4 and the corresponding control wires CL of the partial active area 3. Furthermore, the position of the driving circuit 4 may also be changed according to the needs. For example, still referring to FIG. 1, in some embodiments, as shown in the upper part of FIG. 1, the drive circuit 4 has a symmetry axis AX, which may pass through approximately the midpoint of one side of the active area 3. The plurality of wires 10, 10' electrically connected to the driving circuit 4 may be disposed on both sides of the symmetry axis AX, and exhibit line symmetry along the symmetry axis AX. In some embodiments, as shown on the left side of FIG. 1, the symmetry axis of the driving circuit 4" does not pass through the midpoint of the side of the active area 3. The plurality of wires 10" disposed between the driving element 4" and the active area 3 are disposed in an asymmetrical manner. It should be noted that the positions and arrangements of the wires 10, 10', and 10" shown in FIG. 1 are just some embodiments which are not intended to be limiting.

In some embodiments, in order to have similar impedance between the wires, the respective wires 10, 10' connected to the same driving circuit 4 may have substantially similar lengths when viewing the substrate 2 along the normal direction of the substrate 2 (e.g., in the Z direction in FIG. 1). The wires 10, 10' close to the symmetry axis AX of the driving circuit 4 may have a zig-zag shape to increase the length of the wires so that the length of the wires 10, 10' close to the symmetry axis AX of the driving circuit 4 is similar to the length of the wires 10, 10' away from the symmetry axis AX of the driving circuit 4.

Among the plurality of the wires in the wiring group, at least two adjacent wires respectively have one section formed in one process (thin film-lithography-etching process) and have the other section formed in the other process (thin film-lithography-etching process). In some embodiments, as shown in the upper part of FIG. 1, all wires 10, 10' in the wiring group 5 respectively have one section formed in one process and the other section formed in the other process. In the embodiment shown in FIG. 1, the connection portions 10a, 10a' of the respective wires 10, 10' are electrically connected between different sections of the same wire. In other embodiments, the connection portions 10a, 10a' may be the portions where the sections overlapped and directly connected, or the connection portions 10a, 10a' may be a contact via for filling with conductive material. The contact via is formed in the insulating layer between the two sections and overlaps the two sections. As long as the two sections can be electrically connected, the form of the connection portion is not limited herein. Therefore, in some embodiments, as shown in FIG. 1, the driving circuit 4 to the connection portion 10a, 10a' may be one section, and the side of the connection portion 10a, 10a' to the active area 3 closest to the driving circuit 4 may be the other section.

In some embodiments, each of the wires may be formed of only two sections, as shown by wires 10, 10' in FIG. 1. In some embodiments, each of the wires may be formed of more than three sections, and the sections may also be electrically connected through the connection portions.

It should be noted that in the present disclosure, "the wire A is adjacent to the wire B" means that when viewing the substrate 2 along the normal direction of the substrate 2 (e.g., the Z direction in FIG. 1), there are no other wires between the wire A and the wire B.

In some embodiments, the adjacent sections in the X direction between the wires 10 shown in FIG. 1 (for example, in FIG. 1, the section in each of the two adjacent wires 10 closest to the driving element 4) are formed by different processes. The wires 10' may also have similar arrangements. "Sections are formed by different processes" means that the sections are not formed at the same time. There is no particular limitation that the sections need to be formed by different lithography or etching methods. Since the adjacent sections may not be formed at the same time, the adjacent wires may not be limited by the minimum spacing of the single lithography exposure process or the etching process, so that the adjacent wires may be arranged more closely.

In some embodiments, the non-adjacent sections in the X direction between adjacent wires 10 shown in FIG. 1 are sections formed by the same process. For example, one section close to the driving element 4 in one wire 10 and the other section away from the driving circuit 4 in the other adjacent wire 10 are sections formed by the same process. "Section are formed by the same process" means that the sections are formed at the same time. That is, in this embodiment, one section of each of the wires 10 shown in FIG. 1 may be formed at the same time. These sections are non-adjacent sections in the X direction. The other section of each wire 10 may be formed by the other process at the same time, and the connection portions may be formed in the two processes to electrically connect the two sections, thereby forming wire 10. The wires 10' may also have similar arrangements. It should be noted that the "section is formed by the same process" only means that the section is the layer formed at the same time. However, the sections formed by the same process do not need to have the same distance from the substrate when viewing the substrate along the normal direction of the substrate.

In addition, "close to" in "section close to the driving circuit 4" and "away from" in "section away from the driving circuit 4" mentioned in the previous paragraph are compared with the shortest distance between each section and the driving circuit when viewing the substrate along the normal direction of the substrate.

The materials used for the wires 10, 10', 10" described in present disclosure are not particularly limited, as long as the materials used have appropriate conductivity. For example, it may include a metal conductive material, a conductive metal oxide, or a combination thereof. In some embodiments, the metal conductive material may include copper, silver, tin, aluminum, molybdenum, tungsten, gold, chromium, nickel, platinum, the alloy of the metals mentioned above, other suitable conductive materials, or a combination thereof, but is not limited thereto. The conductive metal oxide may include but is not limited to ruthenium oxide, indium zinc oxide, indium gallium zinc oxide (IGZO), indium tin oxide (ITO), indium tin zinc oxide (ITZO), antimony tin oxide (ATO), aluminum zinc oxide (AZO), aluminum zinc oxide, zinc oxide, and indium tin oxide, but is not limited thereto.

In some embodiments, a thin film layer of wires 10, 10' may be formed by using a chemical vapor deposition process, a physical vapor deposition process, an electroplating process, an electroless plating process, other suitable processes, or a combination thereof. The chemical vapor deposition process may include, for example, a low pressure chemical vapor deposition (LPCVD) process, a low temperature chemical vapor deposition (LTCVD) process, and a rapid thermal chemical vapor deposition (RTCVD) process, or a plasma enhanced chemical vapor deposition (PECVD) process, etc. The physical vapor deposition process may include, for example, a sputtering process, an evaporation coating process, or a pulsed laser deposition (PLD) process, etc.

In some embodiments, the substrate 2 may be an intermediate substrate or a target substrate (such as an array substrate) of the electronic device. The substrate 2 may be a rigid or flexible substrate. The substrate 2 may be a single layer or a combination of multiple layers, and its shape is not particularly limited. In some embodiments, the substrate 2 may include glass, quartz, sapphire, polycarbonate (PC), polyimide (PI), polyethylene terephthalate (PET), rubber, glass fiber, other polymer materials, other suitable substrate materials, or a combination thereof, but is not limited thereto. In some embodiments, the substrate 2 may include a metal-glass fiber composite plate, a metal-ceramic composite plate, or the like.

In some embodiments, the active area 3 is an area having pixel units PX. In some embodiments, the pixel unit PX may be a pixel unit PX with a display function or a pixel unit PX not used for display. For example, the pixel unit PX nay be used as an antenna or a sensing unit. In some embodiments, each pixel unit PX may be defined as the range enclosed by the intersecting control wires CL for scan signal transmission and the control wires CL for data signal transmission. At least one pixel electrode may be in the range. If the pixel unit has a switching element SW (such as a thin film transistor) to control the pixel electrode, it is called an active pixel unit PX. The array formed of a plurality of the active pixel units PX is called the active area 3.

In some embodiments, the driving circuits 4 and 4" may be disposed on the substrate 2 by, for example, chip on glass (COG) technology or any other suitable electrical bonding technology. In some embodiments, the driving circuits 4 and 4" may be further electrically connected to additional circuit elements such as flexible printed circuit (FPC) by using chip on glass (COG), or chip on film (COF), etc.

In order to further explain the structure of the wires in the wiring group 5 shown in FIG. 1, the following is a description of the four wires in the area A1 shown in FIG. 1.

Figure 2A:
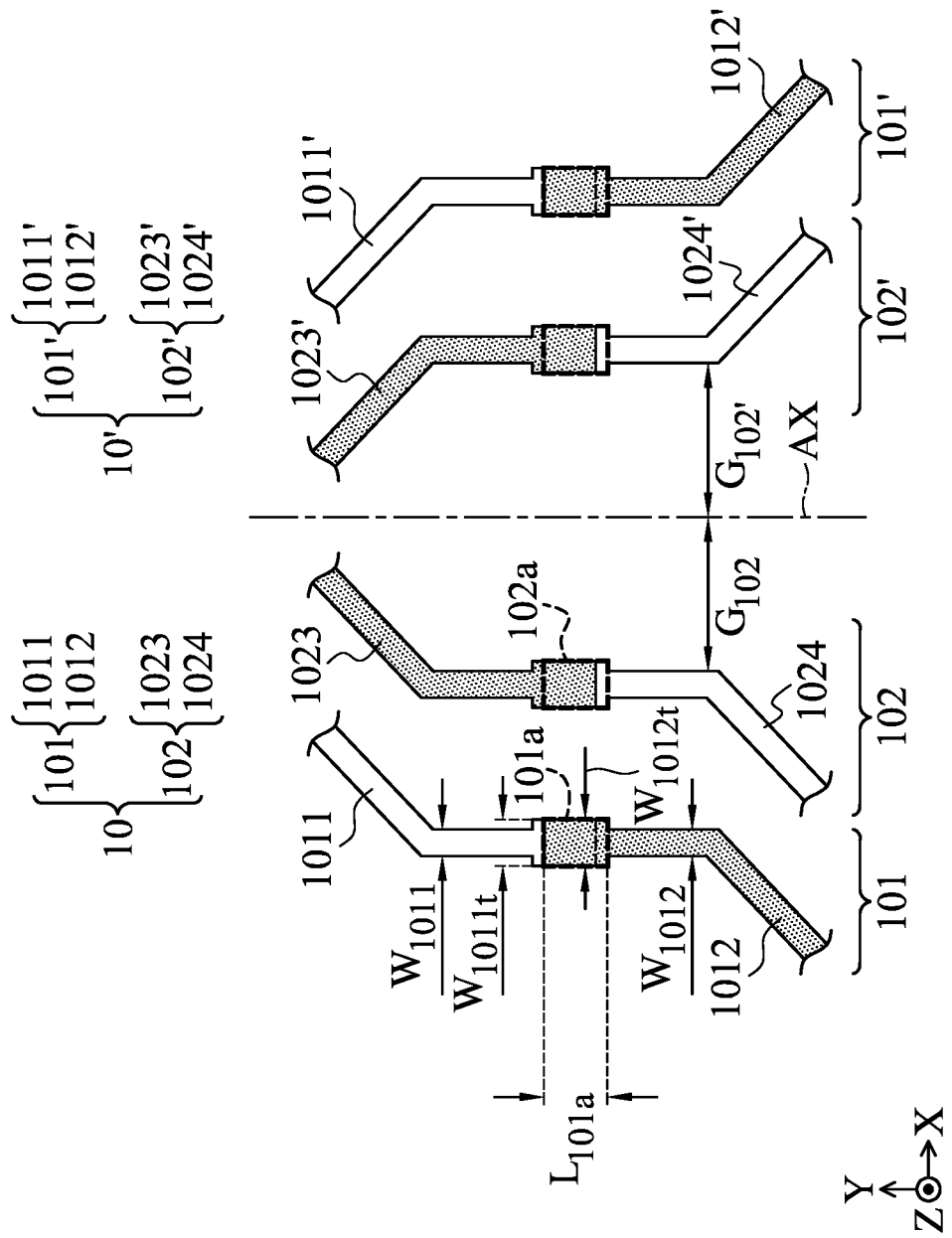
FIGS. 2A and 2B schematically illustrate a top view of four wires in area A1 of FIG. 1 according to some embodiments of the present disclosure.

Referring to FIG. 2A, FIG. 2A schematically illustrates a top view of four wires (two wires 10 and two wires 10') in area A1 of FIG. 1 according to some embodiments of the present disclosure. For simplicity, only the four wires are drawn in FIG. 2A, and the substrate 2 and other components such as insulating layers are omitted. Furthermore, FIG. 2A may be regarded as an enlarged view of a portion of FIG. 1. In this embodiment, although the active area 3 is not shown in FIG. 2A, the active area 3 is under the four wires shown in FIG. 2A (toward the negative Y direction in FIG. 2A).

For convenience, the leftmost wire in FIG. 2A is hereinafter referred to as the first wire 101 and the wire adjacent to the first wire 101 is the second wire 102. On the right side in FIG. 2A, two wires that are line-symmetric with the first wire 101 and the second wire 102 along the symmetry axis AX are the other first wire 101' and the other second wire 102', respectively. For example, since the second wire 102 and the second wire 102' are symmetrical to each other with the symmetry axis AX, there is a gap $G_{102}$ between the second wire 102 and the symmetry axis AX in the X direction. There is a gap $G_{102'}$ between the second wire 102' and the symmetry axis AX in the X direction. The gap $G_{102}$ and the gap $G_{102'}$ are substantially the same.

Still referring to FIG. 2A, in some embodiments, the first wire 101 includes a first section 1011 away from the active area 3, and a second section 1012 close to the active area 3. The second section 1012 is disposed between the first section 1011 and the active area 3. The second wire 102 includes a third section 1023 away from the active area 3, and a fourth section 1024 close to the active area 3. The fourth section 1024 is disposed between the third section 1023 and the active area 3. The other first wire 101' symmetrical to the first wire 101 also includes the other first section 1011' and the other second section 1012'. The other second section 1012' is disposed between the other first section 1011' and the active area 3. The other second wire 102' also includes the other third section 1023' and the other fourth section 1024'. The other fourth section 1024' is disposed between the other third section 1023' and the active area 3.

In the embodiment shown in FIG. 2A, the shapes of the wires and the arrangement of the sections on both sides of the symmetry axis AX are symmetrical to each other. Therefore, for simplicity, the following description is of the first wire 101 and the second wire 102 on the left side, as shown in FIG. 2A.

In the embodiment shown in FIG. 2A, as some of the embodiments previously described, on one side of the symmetry axis AX, the non-adjacent sections between adjacent wires in the X direction are formed simultaneously (e.g., by using the same process). That is, for example, the first section 1011 of the first wire 101 and the fourth section 1024 of the second wire 102 are formed simultaneously, and the second section 1012 of the first wire 101 and the third section 1023 of the second wire 102 are formed simultaneously. The first section 1011 and the fourth section 1024 are the same layer, and the second section 1012 and the third section 1023 are the same layer.

The first section 1011 and the fourth section 1024 are formed by one process, and the second section 1012 and the third section 1023 are formed by the other process. The first section 1011 and the second section 1012 in the first wire 101 are different layers formed by different processes. The third section 1023 and the fourth section 1024 in the second wire 102 are different layers formed by different processes. It should be noted that the "different layers formed by different processes" does not limit that the formed layers have different distances from the substrate when viewing the substrate along the normal direction of the substrate. In some embodiments, different layers formed by different processes may have substantially the same distance from the substrate when viewing the substrate along the normal direction of the substrate.

In the embodiment of FIG. 2A, the second section 1012 and the third section 1023 are formed after the first section 1011 and the fourth section 1024. Therefore, when the second section 1012 overlaps the first section 1011 in the first wire 101, the second section 1012 will be above the first section 1011. Similarly, when the third section 1023 overlaps the fourth section 1024 in the second wire 102, the third section 1023 will be above the fourth section 1024.

Still referring to FIG. 2A, as described in some previous embodiments, the two different sections in each wire are electrically connected through the connection portion. In FIG. 2A, the first section 1011 and the second section 1012 are electrically connected by directly contacting the partial first section 1011 and the partial second section 1012. Similarly, the third section 1023 and the fourth section 1024 are electrically connected by directly contacting the partial third section 1023 and the partial fourth section 1024. In other embodiments, the partial first section 1011 and the partial second section 1012 are electrically connected through the contact via. The partial third section 1023 and the partial fourth section 1024 are electrically connected through the contact via.

In some embodiments, as shown in FIG. 2A, when two different sections of the same wire are electrically connected by partial direct contact, the connection portion of the wire may be defined as the overlapping portion between the two different sections as viewing the substrate 2 (not shown in FIG. 2A) along the normal direction (the Z direction in FIG. 2A) of the substrate 2. For example, as shown in FIG. 2A, in the first wire 101, one end of the second section 1012 covers one end of the first section 1011. In this embodiment, the width $W_{1012t}$ of one end of the second section 1012 in the X direction is approximately equal to the width $W_{1011t}$ of one end of the first section 1011 close to the second section 1012 in the X direction. Therefore, the connection portion 101a of the first wire 101 may be shown by the dotted area 101a of the first wire 101, that is, the overlapping portion of the first section 1011 and the second section 1012. In other embodiments, the width $W_{1011t}$ of the connection portion where the end of the second section 1012 overlaps the first section 1011 in the X direction may be greater or smaller than the width $W_{1011t}$ of the end of the first section 1011 close to the second section 1012 along the X direction. It is not intended to be limiting. In some embodiments, as shown in FIG. 2A, one end with width $W_{1011t}$ of the second section 1012 includes a length $L_{101a}$ in the Y direction.

Other arrangement different from partial direct contact for electrically connecting the two different sections of the same wire may be provided. For example, as shown by the second conductor 102 in FIG. 2A, the width (not shown) of one end of the third section 1023 at the upper layer close to the fourth section 1024 approximately equal to the width (not shown) of one end of the fourth section 1024 close to the third section in the X direction. The connection portion 102a of the second wire 102 may be illustrated by the dotted area 102a of the second wire 102. In other embodiments, the width of the end of the third section 1023 close to the fourth section 1024 may be greater or smaller than the width of one end of the fourth section 1024 close to the third section in the X direction. It is not intended to be limiting.

In some embodiments, as shown in FIG. 2A, each section in the wire 10 may have a different width. For example, when viewing the substrate 2 (not shown) in the Z direction, the width of the end of the first section 1011 close to the second section 1012 (e.g., the width $W_{1011t}$ in the X direction) may be greater than the width of the end of the first section 1011 away from the second section 1012 (e.g., the minimum width $W_{1011}$ in the X direction). Similarly, the width of the end of the second section 1012 close to the first section 1011 (e.g., the width $W_{1012t}$ in the X direction) may be greater than the width of the end of the second section 1012 away from the first section 1011 (e.g., the minimum width $W_{1012}$ in the X direction). In other words, the width of each wire 10 close to the connection portion may be greater than or equal to the width of each wire 10 away from the connection portion.

In some embodiments, the length of each section of the single wire may be approximately the same or different when viewing the substrate along the normal direction of the substrate. In the present disclosure, the length of the wire or the section of the wire is the total length of the center line of the wire or the section of the wire. In some embodiments, the length of each section of the single wire may be approximately the same. For example, in FIG. 2A, when viewing the substrate 2 along the Z direction, the ratio of the length of the first section 1011 to the length of the second section 1012 in the first wire 101 may be between 1.2 and 0.8 (less than or equal to 1.2 and greater than or equal to 0.8), or between 1.1 and 0.9 (less than or equal to 1.1 and greater than or equal to 0.9). When there are only two sections in the single wire and the lengths of the two sections are similar, the properties of the sections may be similar. When there is process variation, it is not easy to introduce regional differences, and it is not easy to cause stripes or mura in the display area when the signal is transmitted into the pixel due to the structural difference between the wires.

There may be other suitable methods for electrically connecting the two different sections, other than making two different sections of the same wire directly contact a part of the overlap. For example, the two sections may be electrically connected through a contact via or another conductive layer at the overlap of the two sections. The electrical connection structure in the single wire is described in more detail below.

Figure 2B:
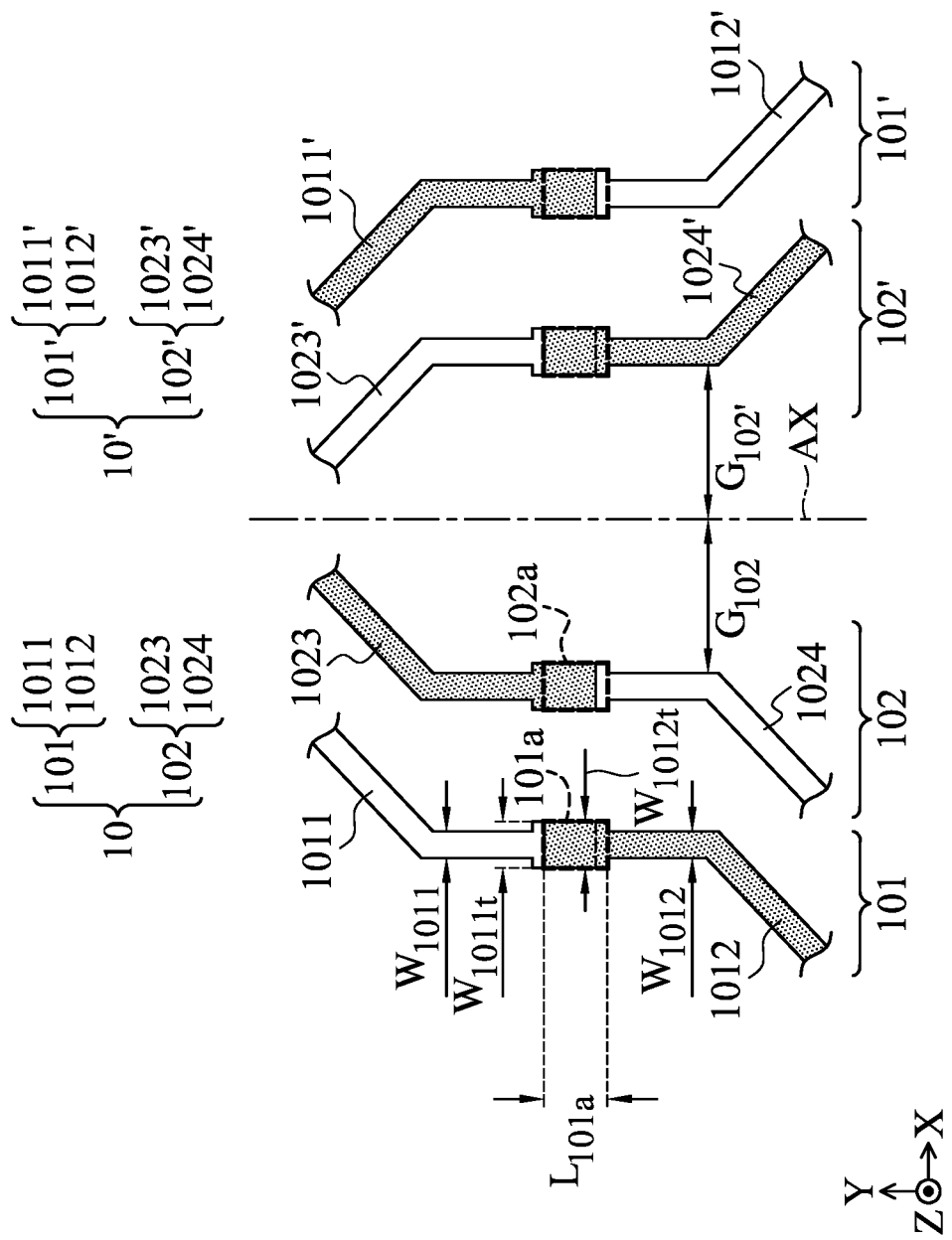

Referring to FIG. 2B, which schematically illustrates a top view of four wires in the area A1 of FIG. 1 according to some embodiments of the present disclosure. The configuration of the wiring in FIG. 2B is substantially the same as that in FIG. 2A. The difference is that in FIG. 2A, the shapes of the wires and the arrangement of the sections on both sides of the symmetry axis AX are symmetrical to each other. In FIG. 2B, the wires on both sides of the symmetry axis AX are only symmetrical in shape, but the arrangement of the sections is not symmetrical.

For example, in the embodiment shown in FIG. 2B, the shape of the first wire 101 and the shape of the other first wire 101' are linearly symmetrical along the symmetry axis AX. However, the first section 1011 in the first wire 101 and the other first section 1011' in the other first wire 101' are not formed by the same process. Similarly, the second section 1012 in the first wire 101 and the other second section 1012' in the other first wire 101' are not formed by the same process. That is, the first section 1011 and the other first section 1011' are different layers, and the second section 1012 and the other second section 1012' are different layers.

For example, in some embodiments, as shown in FIG. 2B, the first section 1011 in the first wire 101 may be formed simultaneously with the other second section 1012' in the other first wire 101'. Then the second section 1012 and the other first section 1011' are formed. The first section 1011 and the other first section 1011' are different layers. The second section 1012 and the other second section 1012' are also different layers.

Depending on actual needs, the shape of the wires in the wiring group may be linearly symmetrical or asymmetrical on both sides. Therefore, for simplicity, the following will use only the two wires on the left (e.g., the first wire 101 and the second wire 102) for description. The wires on the other side or the wiring in the overall wiring group may be adjusted according to actual needs.

Figure 3:
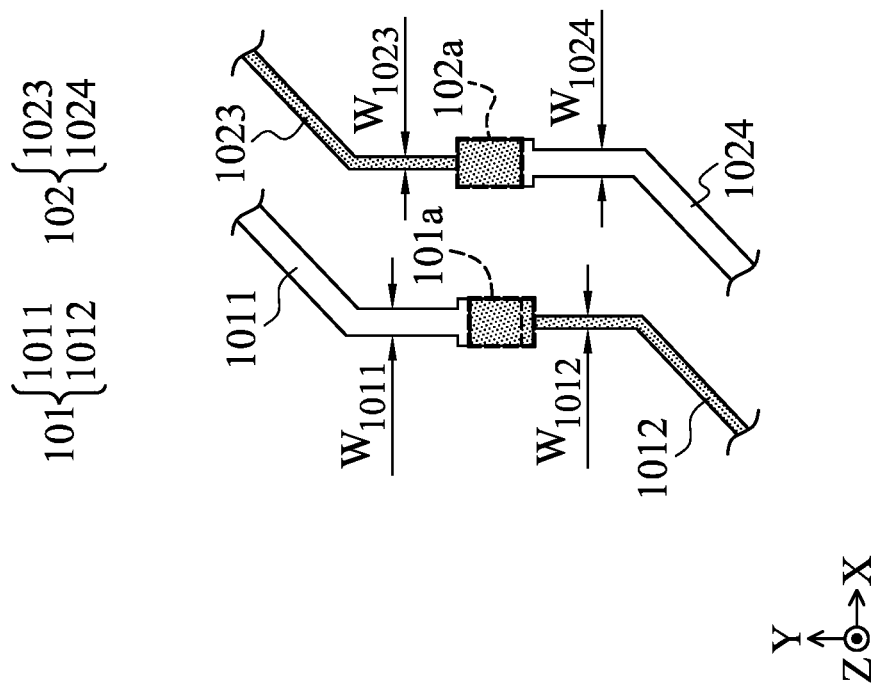
FIGS. 3-6 schematically illustrate a portion of top view of two wires according to some embodiments of the present disclosure.

Referring to FIG. 3, FIG. 3 schematically illustrates a portion of top view of two wires according to some embodiments of the present disclosure. In some embodiments, as shown in FIG. 3, when viewing the substrate 2 along the normal direction (e.g., the Z direction in FIG. 3) of the substrate 2 (not shown), the widths of different sections of the same wire may be different. For example, in FIG. 3, the first section 1011 in the first wire 101 has a width that may be the minimum width $W_{1011}$ in the X direction. The second section 1012 in the first wire 101 has a width that may be the minimum width $W_{1012}$ in the X direction. The width $W_{1011}$ is different from the width $W_{1012}$. In the embodiment of FIG. 3, the width $W_{1011}$ is greater than the width $W_{1012}$.

In some embodiments, as shown in FIG. 3, the first section 1011 and the fourth section 1024 are the same layer, and they may have approximately the same width. That is, the minimum width $W_{1011}$ of the first section 1011 in the X direction and the minimum width $W_{1024}$ of the fourth section 1024 in the X direction may be approximately the same. The second section 1012 and the third section 1023 are the same layer, and they may have approximately the same width. That is, the minimum width $W_{1012}$ of the second section 1012 in the X direction and the minimum width $W_{1023}$ of the third section 1023 in the X direction may be approximately the same.

Figure 4:
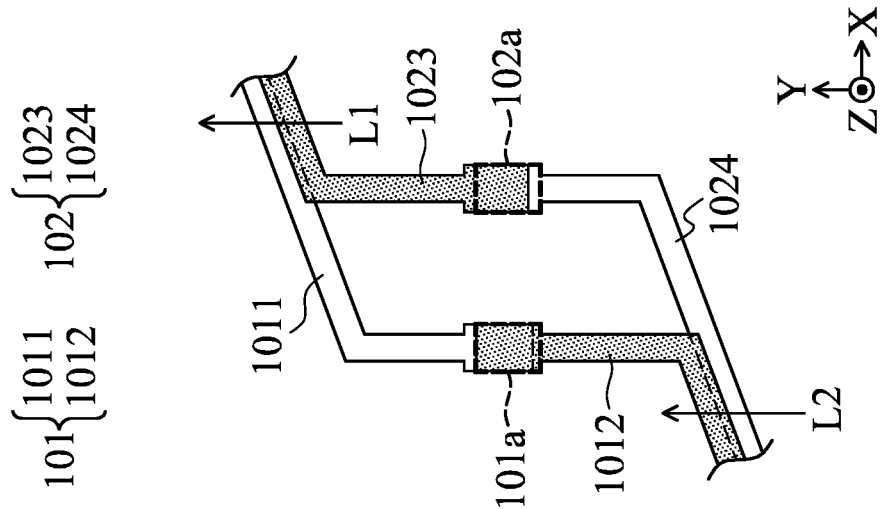

Referring to FIG. 4, FIG. 4 schematically illustrates a portion of top view of two wires according to some embodiments of the present disclosure. In some embodiments, there may be partial overlap between adjacent sections of different wires when viewing the substrate along the normal direction of the substrate.

For example, as shown in FIG. 4, the first section 1011 in the first wire 101 may partially overlap the third section 1023 in the second wire 102 when viewing the substrate 2 along the normal direction (e.g., the Z direction in FIG. 4) of the substrate 2 (not shown). The second section 1012 in the first wire 101 may partially overlap the fourth section 1024 in the second wire 102. In some embodiments, only the first section 1011 may partially overlap the third section 1023, or only the second section 1012 may partially overlap the fourth section 1024.

It should be noted that, in the embodiment shown in FIG. 4, although the active area 3 is not shown in FIG. 4, the active area is under (e.g., in negative Y direction) the two wires. Furthermore, different wires (such as the first wire 101 and the second wire 102) are not electrically connected to each other, and different wires drive the corresponding pixel units PX in the active area 3 with independent input signals.

In some embodiments, as shown in FIG. 4, at least one portion of the third section 1023 is closer than the first section 1011 to the active area 3 (not shown), and/or at least one portion of the fourth section 1024 is closer the second section 1012 to the active area 3 (not shown) when viewing the substrate 2 along the normal direction (e.g., the Z direction in FIG. 4) of the substrate 2 (not shown).

That is, as shown in FIG. 4, a straight line L1 parallel to the Y axis in FIG. 4 from the active area 3 (not shown) to the outside of the substrate 2 and parallel to the substrate 2 may pass through the third section 1023, the region where the first section 1011 partially overlaps the third section 1023, and the first section 1011 when viewing the substrate 2 along the normal direction (e.g., the Z direction in FIG. 4) of the substrate 2 (not shown). Or, the other straight line L2 parallel to the Y axis in FIG. 4 from the active area 3 to the outside of the substrate 2 and parallel to the substrate 2 may pass through the fourth section 1024, in the region where the section 1012 partially overlaps the fourth section 1024, and the second section 1012.

Figure 5:
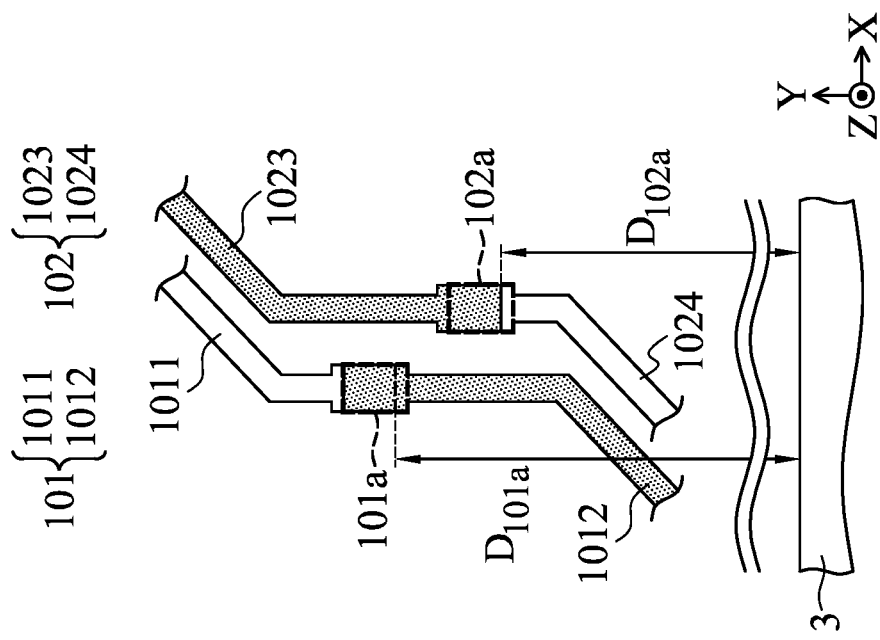

Referring to FIG. 5, FIG. 5 schematically illustrates a portion of top view of two wires according to some embodiments of the present disclosure. In some embodiments, when looking down on the substrate, the connection portions of adjacent wires may be staggered from each other. For example, in the embodiment shown in FIG. 5, the first connection portion 101a of the first wire 101 has a shortest distance $D_{101a}$ from the side of the active area 3 in the Y direction. The second connection portion 102a of the second wire 102 has a shortest distance $D_{102a}$ from the side of the active area 3 in the Y direction. Distance $D_{101a}$ is different from distance $D_{102a}$. In the embodiment shown in FIG. 5, the distance $D_{101a}$ is greater than the distance $D_{102a}$. By staggering the connection portions of adjacent wires, two adjacent wires may be arranged more closely.

Figure 6:
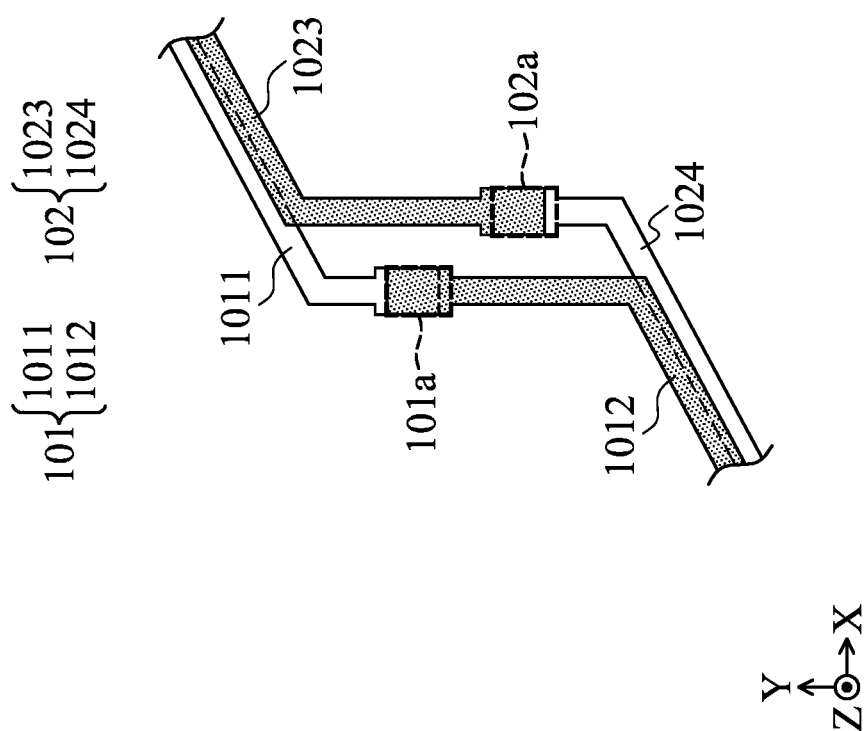

Referring to FIG. 6, FIG. 6 schematically illustrates a portion of top view of two wires according to some embodiments of the present disclosure. In some embodiments, as shown in FIG. 6, in addition to the partial overlap between two adjacent wires, the connection portions of the wires may also be staggered from each other. That is, the embodiment shown in FIG. 6 may be regarded as having the features of the embodiment shown in FIG. 4 and FIG. 5 at the same time.

Figures 7A, 7B:
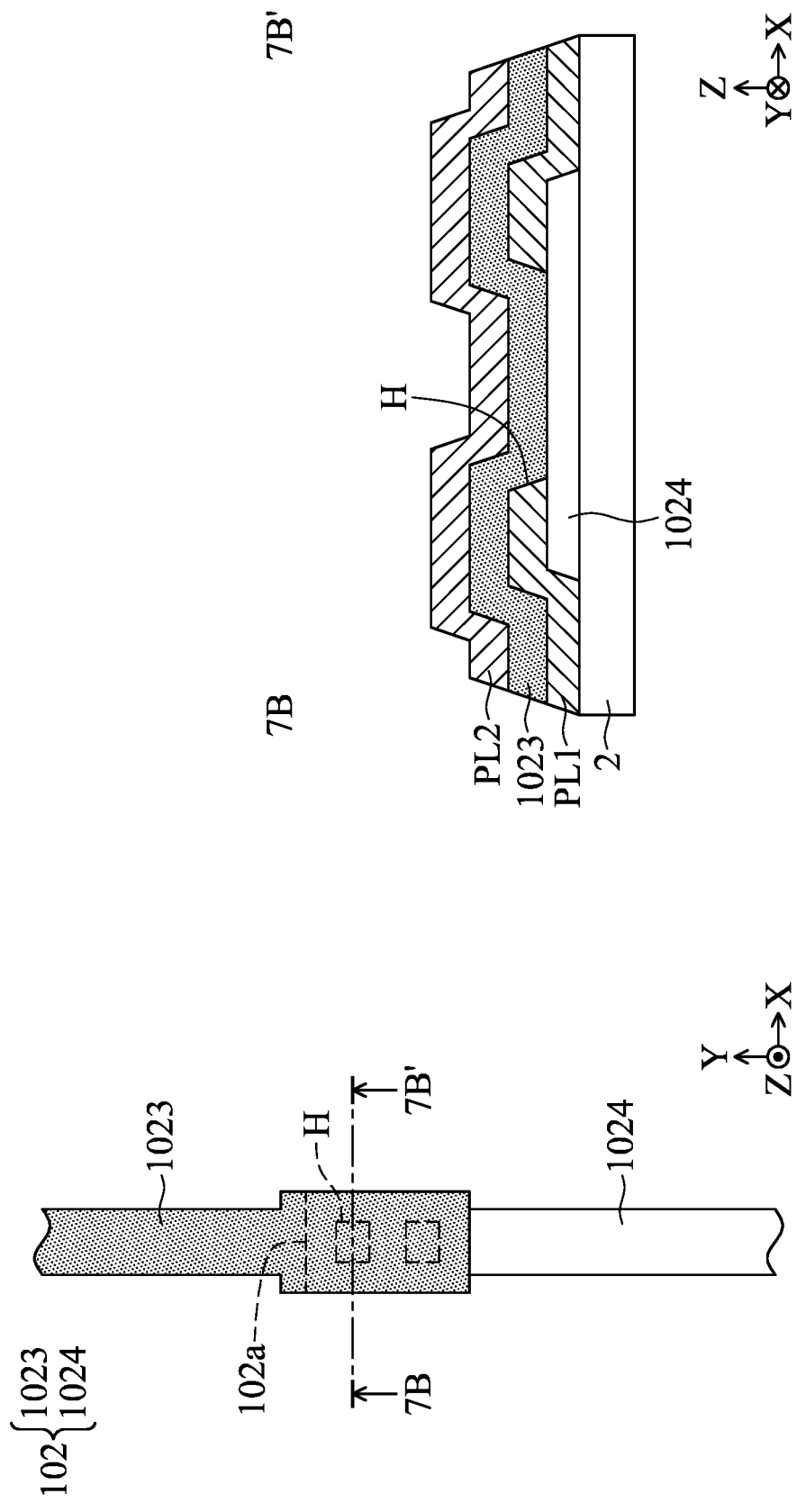
FIG. 7A schematically illustrates a top view of a portion of the wire according to some embodiments of the present disclosure.
FIG. 7B schematically illustrates a cross-sectional view taken along line 7B-7B' in FIG. 7A according to some embodiments of the present disclosure.
Figures 8A, 8B:
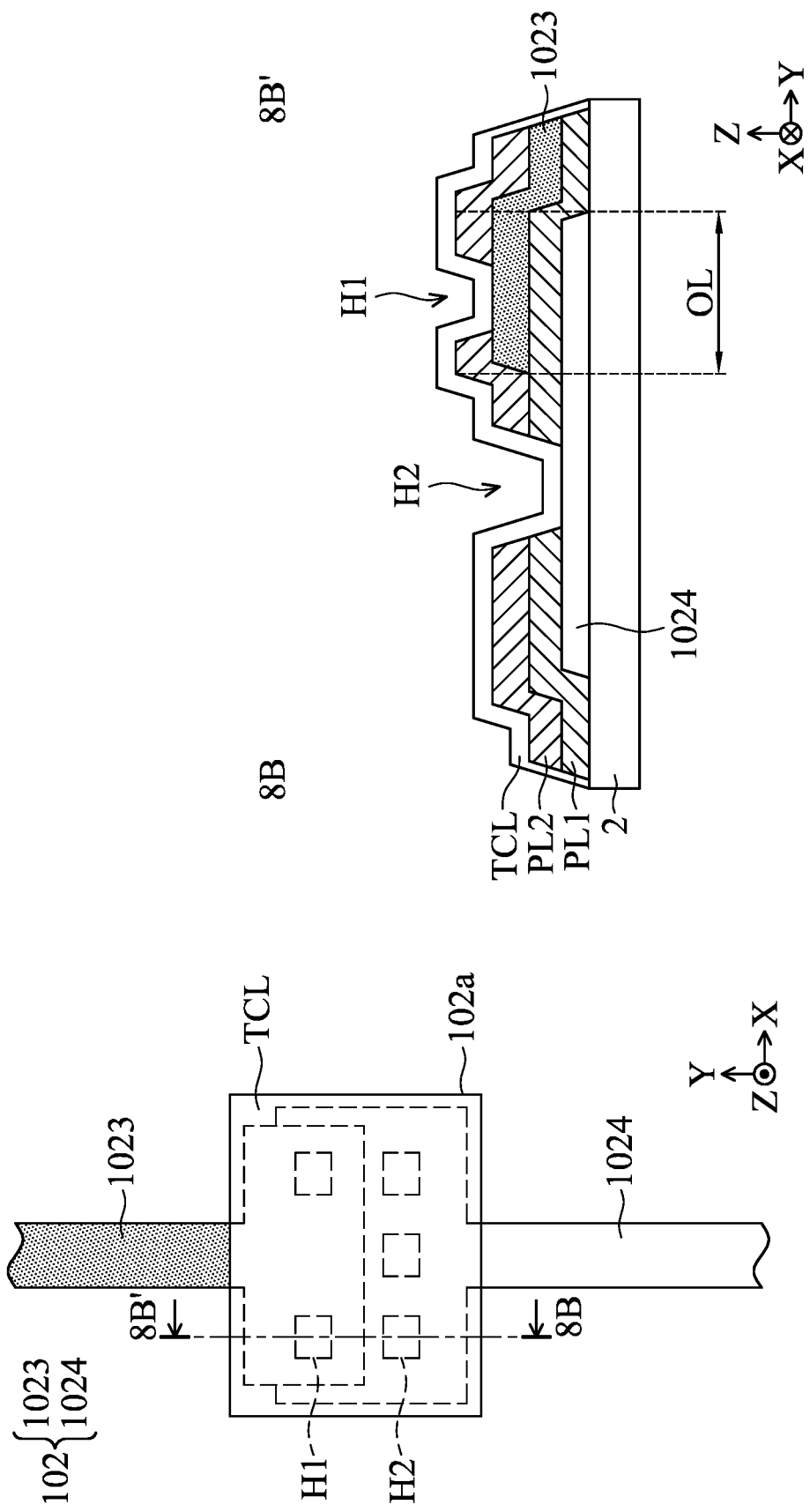
FIG. 8A schematically illustrates a top view of a portion of the wire according to an embodiment of the present disclosure.
FIG. 8B schematically illustrates a cross-sectional view taken along line 8B-8B' in FIG. 8A according to some embodiments of the present disclosure.

Referring to FIGS. 7A, 7B, 8A, and 8B, FIGS. 7A, 7B, 8A, and 8B further illustrate the electrical connection methods that may be used between different sections in the single wire. FIGS. 7A and 7B illustrate that in some embodiments, the overlapping portions of the connecting portions of the wires between different sections are in direct contact for electrical connection. FIGS. 8A and 8B illustrate that in some embodiments, different sections are electrically connected by other conductive layers. It should be understood that the disclosed embodiment is not limited to the configuration of the connection portion 102a shown in FIGS. 7A and 8A. According to some embodiments, a suitable number of contact via and a suitable arrangement of contact via may be selected depending on requirements.

Referring to FIGS. 7A and 7B, FIG. 7A schematically illustrates a top view (viewing the substrate 2 (not shown) in the Z direction in FIG. 7A) of a portion of the wire according to some embodiments of the present disclosure. FIG. 7B schematically illustrates a cross-sectional view taken along line 7B-7B' in FIG. 7A according to some embodiments of the present disclosure. It should be noted that although FIGS. 7A, 7B, 8A, and 8B are illustrated with the second wire 102, the structure described above is not particularly limited.

In some embodiments, as shown in FIG. 7A, the third section 1023 is formed on the fourth section 1024 with an insulating layer between the third section 1023 and the fourth section 1024 in the second wire 102. A part of the third section 1023 overlaps a part of the fourth section 1024 and the part of the third section 1023 may not be in direct contact with the part of the fourth section 1024 in the overlapping area. The overlapping portion (e.g., the area shown by the dotted line 102a in FIG. 7A) of the third section 1023 may be electrically connected to the overlapping portion of the fourth section 1024 in the Z direction through the contact via H as the connection portion. The insulating layer PL1 (not shown) between the third section 1023 and the fourth section 1024 has the contact via H, so that the part of the third section 1023 may be in direct contact with the fourth section 1024 through the contact via H for electrical connection.

In the embodiment shown in FIG. 7A, the number of the contact via H in the connection portion 102a of the second wire 102 is two, but it is only an embodiment. The number, shape, size, and position of the contact via H may be adjusted according to actual needs. Furthermore, the contact vias in the single connection portion do not need to be consistent. The structure of one of the contact via H is described herein.

Referring to FIG. 7B, FIG. 7B schematically illustrates a cross-sectional view taken along line 7B-7B' in FIG. 7A. In some embodiments, as shown in FIG. 7B, the fourth section 1024 may be formed on the substrate 2. Then the insulating layer PL1 may be formed on the fourth section 1024. Then, the contact via H is formed in the insulating layer PL1. Then the third section 1023 is formed on the fourth section 1024 and the insulating layer PL1. Since the fourth section 1024 is exposed through the contact via H, the third section 1023 may be in direct contact with the fourth section 1024 through the contact via H, so that the third section 1023 is electrically connected to the fourth section 1024.

In some embodiments, as shown in FIG. 7B, another insulating layer PL2 may be formed on the third section 1023. In other embodiments, other layers may be further formed on the structure shown in FIG. 7B according to other requirements. For example, other insulating layers or conductive layers may be formed on the insulating layer PL2. In some embodiments, the insulating layer PL1, the insulating layer PL2, or other layers formed on the insulating layer PL2 may be a multi-layer structure.

In some embodiments, the materials of the insulating layer PL1, the insulating layer PL2, and other insulating layers are not particularly limited, as long as they can achieve the purpose of electrical insulation. For example, it may include silicon oxide, silicon nitride, silicon oxynitride, metal oxide, metal nitride, metal silicide, transition metal oxide, transition metal nitride, transition metal silicide, metal oxynitride, metal aluminate, zirconium silicate, resin, other suitable materials, or a combination thereof. It is not intended to limit herein. In some embodiments, the insulating layer PL1, the insulating layer PL2, or other insulating layers may be formed by a chemical vapor deposition process, a spin coating process, other suitable processes, or a combination thereof.

Referring to FIG. 8A, FIG. 8A schematically illustrates a top view (viewing the substrate 2 (not shown) in the Z direction in FIG. 8A) of a portion of the wire according to an embodiment of the present disclosure. In some embodiments, the two sections in the single wire are electrically connected through other conductive layers. For example, as shown in FIG. 8A, although the third section 1023 is still formed on the fourth section 1024, in this embodiment, the third section 1023 is not in direct contact with the fourth section 1024. The third section 1023 and the fourth section 1024 are separated by the insulating layer PL1 (not shown). The third section 1023 is electrically connected to the fourth section 1024 through the top conductive layer TCL.

In some embodiments, when two different sections of the same wire are not in direct contact for electrical connection, the connection portion of the wire may be defined as an area of the conductive layer for electrically connecting the two sections as viewing the substrate along the normal direction of the substrate. For example, in the embodiment shown in FIG. 8A, the range of the connection portion of the second wire 102 may be defined as the area of the top conductive layer TCL (e.g., the area shown by the dotted line 102a in FIG. 8A) when viewing the substrate along the normal direction (the Z direction in FIG. 8A) of the substrate (not shown).

In some embodiments, as shown in FIG. 8A, in order to electrically connect two sections that are not in direct contact, the contact via H1 exposing the third section 1023, the contact via H2 exposing the fourth section 1024, and the top conductive layer TCL filled in the contact via H1 and H2 and in direct contact with the third section 1023 and the fourth section 1024 may be disposed in the connecting portion 102a to make the third section 1023 electrically connect to the fourth section 1024.

In the embodiment shown in FIG. 8A, there are two contact vias H1 exposing the third section 1023, and three contact vias H2 exposing the fourth section 1024. However, it is just an embodiment. The number, shape, size, and position of the contact via H1 and the contact via H2 may be adjusted according to actual needs. The contact via H1 and the contact via H2 do not need to be the same.

In some embodiments, two sections of different layers are electrically connected through other conductive layers without direct contact. Therefore, in some of the embodiments, the third section 1023 does not overlap the fourth section 1024 in the top view of FIG. 8A.

Referring to FIG. 8B, FIG. 8B schematically illustrates a cross-sectional view taken along line 8B-8B' in FIG. 8A. In some embodiments, as shown in FIG. 8B, the fourth section 1024 may be formed on the substrate 2. Then the insulating layer PL1 may be formed on the fourth section 1024. Then, the third section 1023 and the insulating layer PL2 are formed on the insulating layer PL1. The third section 1023 and the fourth section 1024 are electrically insulated by the insulating layer PL1. Next, the contact via H1 exposing the third section 1023 and the contact via H2 exposing the fourth section 1024 may be formed. Then, the top conductive layer TCL filled in the contact vias H1, H2 and directly contacting the third section 1023 and the fourth section 1024 may be formed.

In some embodiments, the structure shown in FIG. 8B may have other layers. For example, there may be other layers between the top conductive layer TCL and the insulating layer PL2. For example, there may be other insulating layers between the top conductive layer TCL and the insulating layer PL2.

In some embodiments, as shown in FIG. 8B, an overlap area OL may be formed between the third section 1023 and the fourth section 1024. As mentioned earlier, in other embodiments, the third segment 1023 may not overlap the fourth segment 1024 as viewing the substrate 2 (not shown) in the Z direction in FIG. 8A. Therefore, in some embodiments, there is no overlap area OL between the third segment 1023 and the fourth segment 1024. In some embodiments, in order for the contact via H2 to expose the fourth segment 1024, at least one portion of the fourth segment 1024 is not covered by the third segment 1023 in the connection portion 102a in FIG. 8A.

The material of the top conductive layer TCL is not particularly limited, as long as the material used has appropriate conductivity. The material used for the top conductive layer TCL may be the material used for the wire 10 as previously described. In some embodiments, the top conductive layer TCL may include a transparent conductive material or metal such as indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), copper (Cu), aluminum (Al), silver (Ag), gold (Au), titanium (Ti), other suitable conductive materials or combinations thereof. It is not intended to limit herein.

Referring to FIGS. 9A to 9C, FIG. 9A schematically illustrates a portion of top view of two wires according to some embodiments of the present disclosure. FIG. 9A is same as FIG. 4 of the present disclosure. For the purpose of comparison with FIGS. 9B and 9C, FIG. 4 is reproduced as FIG. 9A herein. FIGS. 9B and 9C are the schematic diagrams of the displacement of different sections in the same layer resulting from the process variation illustrated in FIG. 9A.

The following is illustrated by FIGS. 9A to 9C that not only the difference in load (e.g., resistance) caused by space variation may be dispersed but the difference in load (e.g., capacitance) of adjacent wires caused by position variation may be reduced when the adjacent segments of adjacent wires partially overlap and the segments have a specific configuration.

Referring to FIG. 9A, in the embodiment of FIG. 9A, since FIG. 9A is same as FIG. 4 of the present disclosure, the arrangement of the first wire 101 and the second wire 102 will be the same as that of FIG. 4. In these embodiments, the first segment 1011 of the first wire 101 and the fourth segment 1024 of the second wire 102 are the same layer. The second segment 1012 and the third segment 1023 are the same layer. The second segment 1012 and the third segment 1023 are formed on the first segment 1011 and the fourth segment 1024. The first segment 1011 partially overlaps the third segment 1023, and the second segment 1012 partially overlaps the fourth segment 1023.

Still referring to FIG. 9A, the straight line L1 from the active area 3 (not shown) to the outside of the substrate 2 and parallel to the substrate 2 may pass through the third section 1023, the region where the first section 1011 partially overlaps the third section 1023, and the first section 1011 when viewing the substrate 2 along the normal direction (e.g., the Z direction in FIG. 9A) of the substrate 2 (not shown). The other straight line L2 from the active area 3 to the outside of the substrate 2 and parallel to the substrate 2 may pass through the fourth section 1024, in the region where the section 1012 partially overlaps the fourth section 1024, and the second section 1012.

With the second segment 1012 and the third segment 1023 formed at the same time, compared with the adjacent segment (e.g., the fourth section 1024 in FIG. 9A) in the adjacent wire, let one segment (e.g., the second section 1012 in FIG. 9A) at the overlap of the adjacent segment in the adjacent wire be farther away from the active area 3 in the Y direction; compared with the adjacent segment (e.g., the first section 1011 in FIG. 9A) in the adjacent wire, let the other segment (e.g., the third section 1023 in FIG. 9A) at the overlap of the adjacent segment in the adjacent wire be closer to the active area 3 in the Y direction. It may achieve the effect of reducing the difference in the load (such as capacitance) of adjacent wires caused by position variation. The principle of its efficacy will be explained as follow.

Referring to FIG. 9B, FIG. 9B is the schematic diagram of the displacement of different sections in the same layer resulting from the process variation illustrated in FIG. 9A. In FIG. 9B, the second segment 1012 and the third segment 1023 are formed later than the first segment 1011 and the fourth segment 1024. When process variation occurs, in some embodiments, compared to the originally expected position, the second segment 1012 and the third segment 1023 formed at the same time may be shifted in the direction of D1 (e.g., the Y direction in FIG. 9B), as shown in FIG. 9B.

At this moment, the overlapping area of the first segment 1011 and the third segment 1023 will be increased as the third segment 1023 shifts in the Y direction; the overlapping area between the second segment 1012 and the fourth segment 1024 will be reduced as the second segment 1012 shifts in the Y direction. Therefore, for the first wire 101 and the second wire 102, the variation of the overlapping area has not changed significantly, so the load (such as capacitance) between the first wire 101 and the second wire 102 will not be affected by the position variation of the process and be reduced.

Referring to FIG. 9C, the second segment 1012 and the third segment 1023 formed at the same time are displaced due to process variation. Different from FIG. 9B, in FIG. 9C, the second segment 1012 and the third segment 1023 shifts in the direction D2 (e.g., the negative X direction in FIG. 9C).

At this moment, the overlapping area of the second segment 1012 and the fourth segment 1024 will be reduced as the second segment 1012 shifts in the negative X direction; the overlapping area between the first segment 1011 and the third segment 1023 will be increased as the first segment 1011 shifts in the negative X direction. Therefore, for the first wire 101 and the second wire 102, the variation of the overlapping area has not changed significantly.

From the foregoing, the difference in load (e.g., capacitance) of adjacent wires caused by position variation may be reduced when the adjacent segments of adjacent wires partially overlap and the segments have a specific configuration.

Embodiments of present disclosure provide an electronic device. In the electronic device, each of two adjacent wires has one section formed in one process and the other section formed in the other process, which may make the variations (such as width variation, position variation, etc.) resulting from the processes being dispersed on different sections of the wires, so that there may still be similar loads or impedances between the wires. Therefore, each area of the electronic device is maintained in a state similar to that of the original design to avoid regional changes caused by process variations.

Although some embodiments of the present disclosure and their advantages have been described in detail, it should be understood that various changes, substitutions and alterations can be made herein without departing from the spirit and scope of the disclosure as defined by the appended claims. For example, it will be readily understood by one of ordinary skill in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes an individual embodiment, and the scope of the present disclosure also includes a combination of the claims and the embodiments. The features of the various embodiments can be arbitrarily mixed and used as long as they do not contradict or conflict with the spirit of the invention.

What is claimed is:

1. An electronic device having a peripheral area, comprising:
    a substrate;
    a first conductive line disposed on the substrate in the peripheral area and comprising a first section and a second section electrically connected to the first section, wherein an overlapping region is defined as a region that the first section overlaps the second section in a top view of the electronic device, the first section has a first minimum width inside the overlapping region and a second minimum width outside the overlapping region, the second section has a third minimum width outside the overlapping region, and the first minimum width is greater than the second minimum width and greater than the third minimum width; and
    a first conductive layer disposed on the first section and the second section, wherein the first section is electrically connected to the second section through the conductive layer, wherein the conductive layer, the first section and the second section overlap with each other, wherein the first conductive layer is electrically connected to the first section through a first contact via, and the first conductive layer is electrically connected to the second section through a second contact via wherein the first connect via is different from the second contact via.

2. The electronic device as claimed in claim 1, wherein a part of the first section extends in a first direction, another part of the first section extends in a second direction, a part of the second section extends in a third direction, another part of the second section extends in a fourth direction, the first direction is parallel to the fourth direction, the second direction is parallel to the third direction, and the first direction is different from the second direction.

3. The electronic device as claimed in claim 1, wherein a width of an end portion of the first section is different from a width of an end portion of the second section.

4. The electronic device as claimed in claim 1, further comprising a second conductive line disposed on the substrate and comprising a third section and a fourth section electrically connected to the third section, wherein the first section overlaps the third section.

5. The electronic device as claimed in claim 4, wherein the second section overlaps the fourth section.

6. The electronic device as claimed in claim 1, further comprising an active area outside the peripheral area, a second conductive line disposed on the substrate in the peripheral area and comprising a third section and a fourth section electrically connected to the third section, wherein the second section is disposed between the first section and the active area, the fourth section is disposed between the third section and the active area, a distance between the first section and a side of the active area is different from a distance between the third section and the side of the active area.

7. The electronic device as claimed in claim 6, further comprising a second conductive layer disposed on the third section and the fourth section, wherein the third section is electrically connected to the fourth section through the second conductive layer.

8. The electronic device as claimed in claim 1, wherein the first section and the second section are different layers.

9. The electronic device as claimed in claim 1, wherein, in a horizontal direction of the top view of the electronic device, a maximum width of the first section is different from a maximum width of the second section.

* * * * *